United States Patent
Hou

(10) Patent No.: US 10,886,916 B2
(45) Date of Patent: Jan. 5, 2021

(54) SIGNAL TRANSMISSION CIRCUIT

(71) Applicant: ZTE Corporation, Shenzhen (CN)

(72) Inventor: Fangxi Hou, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 16/632,484

(22) PCT Filed: May 24, 2018

(86) PCT No.: PCT/CN2018/088288
§ 371 (c)(1),
(2) Date: Feb. 20, 2020

(87) PCT Pub. No.: WO2019/015392
PCT Pub. Date: Jan. 24, 2019

(65) Prior Publication Data
US 2020/0228115 A1  Jul. 16, 2020

(30) Foreign Application Priority Data
Jul. 21, 2017 (CN) .......................... 2017 1 0601544

(51) Int. Cl.
*H03K 17/16* (2006.01)
*G06F 13/38* (2006.01)
*G06F 13/40* (2006.01)
*G06F 13/42* (2006.01)
(Continued)

(52) U.S. Cl.
CPC ... *H03K 17/6871* (2013.01); *H03K 17/08116* (2013.01); *H03K 17/162* (2013.01)

(58) Field of Classification Search
None
See application file for complete search history.

(56) References Cited

U.S. PATENT DOCUMENTS 7,298,765 B2 * 11/2007 Ganton ..................... H04J 7/00
                                                        370/537
7,482,853 B2 *  1/2009 Koch ................... H03K 17/005
                                                        327/407
(Continued)

FOREIGN PATENT DOCUMENTS

CN         105872883 A     8/2016
CN         206149480 U     5/2017

*Primary Examiner* — Kenneth B Wells
(74) *Attorney, Agent, or Firm* — NZ Carr Law Office

(57) ABSTRACT

Disclosed is a signal transmission circuit, comprising: a common interface, a first switch, a second switch, and an interference-resistant branch; the common interface is configured to, receive a digital signal through the first switch when the first switch is closed, or to receive an analog signal through the second switch when the second switch is closed; the interference-resistant branch is configured to eliminate an interference of the second switch on the digital signal; a signal input of the interference-resistant branch is configured to receive the digital signal, and a signal output of the interference-resistant branch is connected to a signal input of the first switch; and/or, the signal input of the interference-resistant branch is connected to a signal output of the second switch, and the signal output of the interference-resistant branch is connected to a signal input of the common interface.

14 Claims, 6 Drawing Sheets

(51) Int. Cl.
H03K 17/687 (2006.01)
H03K 17/081 (2006.01)

(56) References Cited

U.S. PATENT DOCUMENTS

| | | | | |
|---|---|---|---|---|
| 7,496,116 | B2* | 2/2009 | Simmons, III | H04Q 11/0471 370/537 |
| 9,294,598 | B2* | 3/2016 | Yamada | H03K 17/6874 |
| 2017/0127203 | A1 | 5/2017 | Ryu | |

* cited by examiner

SIGNAL TRANSMISSION CIRCUIT

This application is based upon and claims priority to Chinese Patent Application No. 201710601544.7, filed on Jul. 21, 2017, the entire content of which is incorporated herein by reference.

TECHNICAL FIELD

The embodiments of the present application relate to, but are not limited to, the field of communication technologies, and in particular, to a signal transmission circuit.

BACKGROUND

In the process of signal transmission, in order to reduce the number of output interfaces, a manner of interface multiplexing is usually adopted to realize the transmission of different signals, so that different signals can be transmitted through a common interface. For example, a manner of multiplexing analog signal pin and digital signal pin on a common interface is adopted to realize the transmission of a digital signal and an analog signal through the common interface. However, in practical application, when the digital signal and the analog signal are transmitted through the same common interface, a quality of the digital signal transmitted through the common interface will be reduced, and even a question of a communication fail occurs.

SUMMARY

The embodiments of the present application aims to provide a signal transmission circuit.

The technical schemes of the present application are implemented as follows:

An embodiment of the present application provides a signal transmission circuit, which includes a common interface, a first switch, a second switch and an interference-resistant branch; herein, the common interface is configured to receive a digital signal through the first switch when the first switch is closed; or to receive an analog signal through the second switch when the second switch is closed; the interference-resistant branched path is configured to eliminate an interference of the second switch on the digital signal; a signal input terminal of the interference-resistant branched path is configured to receive the digital signal, and a signal output terminal of the interference-resistant branched path is connected to a signal input terminal of the first switch; and/or the signal input terminal of the interference-resistant branched path is connected to a signal output terminal of the second switch, and the signal output terminal of the interference-resistant branched path is connected to a signal input terminal of the common interface.

The signal transmission circuit provided by the embodiments of the present application includes: a common interface, a first switch, a second switch and an interference-resistant branched path; wherein, the common interface is configured to receive a digital signal through the first switch when the first switch is closed; or to receive an analog signal through the second switch when the second switch is closed; the interference-resistant branched path is configured to eliminate an interference of the second switch on the digital signal; a signal input terminal of the interference-resistant branched path is configured to receive the digital signal, and a signal output terminal of the interference-resistant branched path is connected to a signal input terminal of the first switch; and/or the signal input terminal of the interference-resistant branched path is connected to a signal output terminal of the second switch, and the signal output terminal of the interference-resistant branched path is connected to a signal input terminal of the common interface. In this way, by adding an interference-resistant branch in the signal transmission circuit, the interference of the analog channel for analog signal transmission such as the analog switch (i.e. the second switch) on the digital signal transmission is reduced, and a communication quality of the digital signal is guaranteed, so as to improve a quality of the digital signal transmitted by the common interface and ensure a successful communication.

DETAILED DESCRIPTION

The technical schemes in the embodiments of the present application will be described clearly and completely below in combination with the drawings in the embodiments of the present application.

Figure 1:
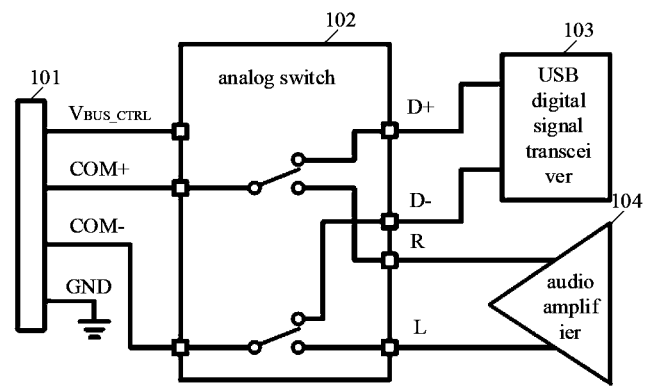
FIG. 1 is a schematic diagram of a switching circuit of a single-pole, double-throw (SPDT) analog switch according to an embodiment of the present application.

As shown in FIG. 1, in order to realize a compatibility between a digital channel and an analog channel in a chip, it is necessary to balance a bandwidth index of the digital channel with a signal distortion index of the analog channel (the digital channel requires large on-resistance and small parasitic capacitance, and the analog channel requires small on-resistance and large parasitic capacitance). However, after a compromise, the bandwidth index of the digital channel and the signal distortion index of the analog channel can not reach the best, increasing an interference of the digital signal and increasing a total harmonic distortion (THD) of the analog channel, and increasing a harmonic component of the analog signal. In order to ensure the bandwidth index, the analog signal distortion index is sacrificed. When the analog signal is an audio signal, a difference between the audio signal index and the high-fidelity (HiFi) index is more obvious, which seriously affects a quality of the audio signal.

For example, universal serial bus type-C (USB type-C) connector is a kind of common interface which can output both digital signal and analog signal, and USB type-C connector is a brand new USB interface form.

Figure 2:
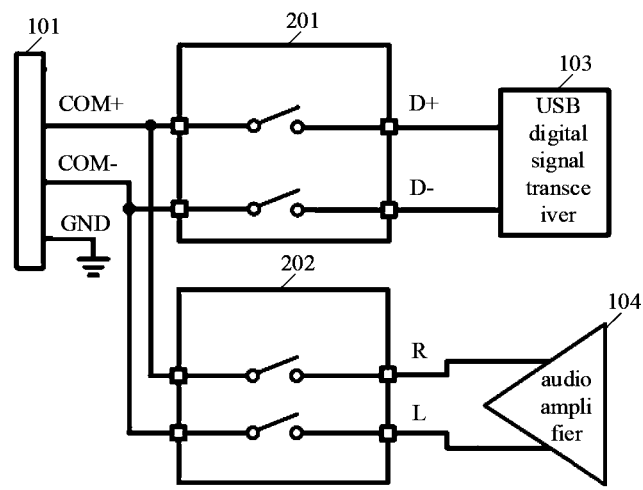
FIG. 2 is a schematic diagram of a switching circuit of a dual analog switch according to an embodiment of the present application.

When the USB type-C connector is used to realize the transmission of the digital signal and the analog signal, a manner for multiplexing the audio analog signal pin of earphone on USB type-C interface and the digital signal pin of USB2.0 communication is adopted. FIG. 1 is a schematic diagram of a switching circuit of a SPDT analog switch according to an embodiment of the present application. As shown in FIG. 1, a USB type-C connector 101 is respectively connected to a USB digital signal transceiver 103 and an audio amplifier 104 through a SPDT analog switch 102. That is, a manner of pin multiplexing is used to switch the SPDT analog switch through bus control ($V_{BUS\_CTRL}$), to realize a switching between the audio analog signal and the digital signal. As the analog switch integrates digital channel and analog channel at the same time, and an analog switch pin has large parasitic capacitance, which can usually reach more than 15 pF. Thus, when the digital channel is connected and analog channel is disconnected, a parasitic capacitance of an analog channel switch pin will seriously interfere with the quality of digital signal, leading to a failure of digital signal transmission. In view of this, FIG. 2 provides a switching circuit of a dual analog switch according to an embodiment of the present application. As shown in FIG. 2, in order to improve the analog signal index, two independent switches including a first switch 201 and a second switch 202 may be used to control the on-off of the digital channel and the analog channel respectively, herein the first switch 201 is used to connect the USB digital signal transceiver 103 and the USB type-C connector 101 in the digital channel, to realize digital signal transmission; the second switch 202 is used to connect the audio amplifier 104 and the USB type-C connector 101 in the analog channel, to realize audio analog signal transmission. In order to ensure that the audio signal distortion index of the analog channel meets the expected requirements, the second switch may be configured as a HiFi analog switch, which has a better audio signal distortion index, so as to ensure an audio output of HiFi level. However, the parasitic capacitance of the pin of the second switch is large, which will seriously interfere with the quality of the digital signal, leading to communication failure. In the signal transmission circuit of the embodiments of the present application, a matching branch for eliminating the interference of the analog switch on the digital signal is added.

An embodiment of the present application provides a signal transmission circuit, which includes: a common interface, a first switch, a second switch and an interference-resistant branch; herein, the common interface is configured to receive a digital signal through the first switch when the first switch is closed; or to receive an analog signal through the second switch when the second switch is closed; the interference-resistant branch is configured to eliminate an interference of the second switch on the digital signal; a signal input of the interference-resistant branch is configured to receive the digital signal, and a signal output of the interference-resistant branch is connected to a signal input of the first switch; and/or the signal input of the interference-resistant branch is connected to a signal output of the second switch, and the signal output of the interference-resistant branch is connected to a signal input of the common interface.

Figure 3:
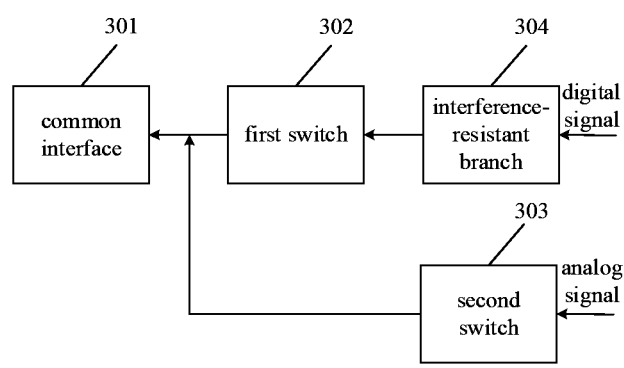
FIG. 3 is a first structure diagram of a signal transmission circuit according to an embodiment of the present application.

FIG. 3 is a first structure diagram of a signal transmission circuit according to an embodiment of the present application. As shown in FIG. 3, the circuit includes: a common interface 301, a first switch 302, a second switch 303 and an interference-resistant branch 304; herein, a signal input of the interference-resistant branch 304 is configured to receive a digital signal, a signal output of the anti-interference circuit 304 is connected to a signal input of the first switch 302, and a signal output of the first switch 302 is connected to a signal input of the common interface 301; a signal input of the second switch 303 is configured to receive an analog signal, and a signal output of the second switch 303 is connected to a signal input of the common interface 301.

Figure 4:
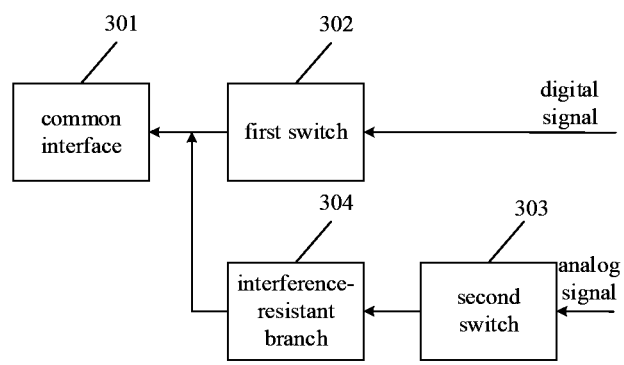
FIG. 4 is a second structure diagram of a signal transmission circuit according to an embodiment of the present application.

FIG. 4 is a second structure diagram of a signal transmission circuit according to an embodiment of the present application. As shown in FIG. 4, the circuit includes: a common interface 301, a first switch 302, a second switch 303 and an interference-resistant branch 304; herein a signal input of the second switch 303 is used to receive an analog signal, a signal output of the second switch 303 is connected to a signal input of the interference-resistant branch 304, and a signal output of the interference-resistant branch 304 is connected to the signal input of the common interface 301; a signal input of the first switch 302 is configured to receive a digital signal, and a signal output of a first switch 302 is connected to the signal input of the common interface 301.

In actual implementation, the interference-resistant branch includes: a first matching branch, a second matching branch, or a combined branch of the first matching branch and the second matching branch; wherein, a signal input of the first matching branch is configured to receive the digital signal, and a signal output of the first matching branch is connected to the signal input of the first switch; a signal input of the second matching branch is connected to the signal output of the second switch, and a signal output of the second matching branch is connected to the signal input of the common interface.

In this embodiment, the interference-resistant branch may include: various types of impedance matching circuits. The interference of various impedances of the analog channel for the analog signal to the digital signal transmission may be offset through impedance matching. For example, if the interference of the analog channel to the digital signal is capacitive interference, the interference-resistant branch may be an inductive branch, which can offset each other through capacitive and inductive matching, to achieve interference offset.

Optionally, in a case of the interference-resistant branch in the circuit described above includes the first matching branch, when the first switch is closed and the second switch is open, the received digital signal is transmitted by the first matching branch to the common interface through the first switch, and the common interface receives and transmits the digital signal to the outside; when the first switch is open and the second switch is closed, the analog signal is transmitted to the common interface through the second switch, and the common interface receives and transmits the analog signal to the outside.

In a case of the interference-resistant branch in the circuit described above includes the second matching branch, when the first switch is closed and the second switch is open, the digital signal is transmitted to the common interface through the first switch, and the common interface receives and transmits the digital signal to the outside; when the first switch is open and the second switch is closed, the analog signal is transmitted to the second matching branch through the second switch, and the second matching branch transmits the received analog signal to the common interface, which receives and transmits the analog signal to the outside.

In a case of the interference-resistant branch in the circuit described above includes a combined branch of the first matching branch and the second matching branch, when the first switch is closed and the second switch is open, the received digital signal is transmitted by the first matching branch to the common interface through the first switch, and the common interface receives and transmits the digital signal to the outside; when the first switch is open and the second switch is closed, the analog signal is transmitted to the second matching branch through the second switch, and the second matching branch transmits the received analog signal to the common interface, which receives and transmits the analog signal to the outside.

In actual implementation, the first matching branch may include at least one inductor connected in series with the signal input of the first switch. Optionally, the inductor in the first matching branch is further connected in series with a resistor; optionally, the inductor in the first matching branch is a stacked inductor.

As an example, at least one inductor in the first matching branch includes: a first inductor and a second inductor; the common interface includes: a first signal input and a second signal input; the first switch includes: a first signal input, a second signal input, a first signal output and a second signal output; the second switch includes: a first signal input, a second signal input, a first signal output and a second signal output; the digital signal includes: a first channel of signal and a second channel of signal; the analog signal includes: a first channel of signal and a second channel of signal; the first signal input of the first switch is connected to one end of the first inductor, the other end of the first inductor is configured to receive the first channel of signal of the digital signal, and the second signal input of the first switch is connected to one end of the second inductor, the other end of the second inductor is configured to receive the second channel of signal of the digital signal, the first signal output of the first switch is connected to the first signal input of the common interface, and the second signal output of the first switch is connected to the second signal input of the common interface; the first signal input of the second switch is configured to receive the first channel of signal of the analog signal, and the second signal of the second switch is configured to receive the second channel of signal of the analog signal; the first signal output of the second switch is connected to the first signal input of the common interface, and the second signal output of the second switch is connected to the second signal input of the common interface.

As an example, an inductance value of the first inductor is equal to an inductance value of the second inductor.

As an example, the first matching branch further includes a first resistor connected in series with the first inductor and a second resistor connected in series with the second inductor.

In actual implementation, the second matching branch may include at least one inductor connected in series between the common interface and the second switch. Optionally, the inductor in the second matching branch is a winding inductor.

As an example, at least one inductor in the second matching branch includes: a third inductor and a fourth inductor; the common interface includes: a first signal input and a second signal input; the first switch includes: a first signal input, a second signal input, a first signal output and a second signal output; the second switch includes: a first signal input, a second signal input, a first signal output and a second signal output; the digital signal includes: a first channel of signal and a second channel of signal; the analog signal includes: a first channel of signal and a second channel of signal; the first signal input of the second switch is configured to receive the first channel of signal of the analog signal, the second signal input of the second switch is configured to receive the second channel of signal of the analog signal, the third inductor is connected in series between the first signal output of the second switch the first signal input of the common interface, and the fourth inductor is connected in series between the second signal output of the second switch and the second signal input of the common interface; the first signal input of the first switch is configured to receive the first channel of signal of the digital signal, the second signal input of the first switch is configured to receive the second channel of signal of the digital signal, the first signal output of the first switch is connected to the first signal input of the common interface, and the second signal output of the first switch is connected to the second signal input of the common interface.

As an example, an inductance value of the third inductor is equal to an inductance value of the fourth inductor.

In practical applications, the inductance value of the inductor of the first matching branch is generally dozens of nanohenries (nH), and the inductance value of the inductor of the second matching branch is generally hundreds of nanohenries, which can be determined according to the capacitance value of the model channel.

It can be understood that when the analog signal is an audio signal, in order to ensure that the analog channel has a better total harmonic distortion plus noise (THD+N) index, the inductor in the first matching branch should select a winding inductor with low noise; the inductor in the second matching branch may use a stacked inductor with low cost. In the actual configuration, it is preferred to first configure the inductor in the first matching branch. After the inductor in the first matching branch is configured, the first matching branch is removed and the second matching branch is added if the first matching branch cannot make the digital signal output by the digital channel meet the signal quality requirements; or the first matching branch and the second matching branch are added at the same time, so that the digital signal output by the digital channel meets the signal quality requirements.

Figure 5:
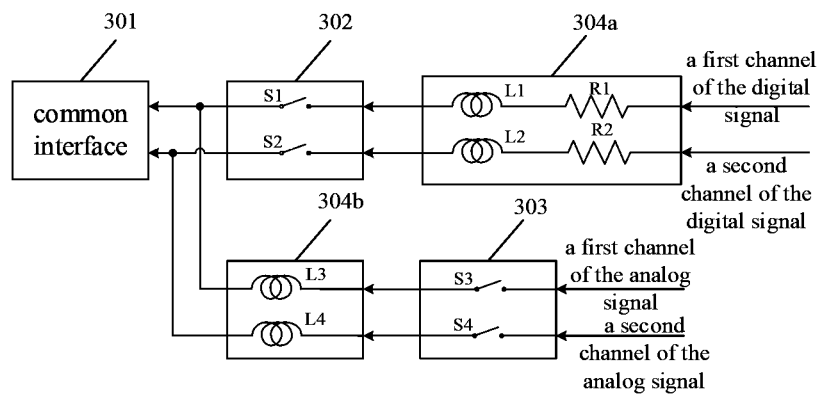
FIG. 5 is a third structure diagram of a signal transmission circuit according to an embodiment of the present application.

FIG. 5 is a third structure diagram of a signal transmission circuit according to an embodiment of the present application. As shown in FIG. 5, the circuit includes: a common interface 301, a first switch 302 and a second switch 303. The circuit may further include: an interference-resistant branch. Further, the interference-resistant branch includes: a first matching branch 304a and a second matching branch 304b. At least one inductor in the first matching branch 304a may include: a first inductor L1 and a second inductor L2; the common interface 301 may include: a first signal input and a second signal input; the first switch 302 may include: a first signal input and a second signal input, and the second switch 303 may include: a first signal output and a second signal output.

In actual implementation, the digital signal is transmitted to the common interface through the first matching branch and the first switch, and then output by the common interface; the analog signal is transmitted to the common interface through the second switch and the second matching branch, and then output by the common interface.

As an example, the first signal input of the first switch 302 is connected to one end of the first inductor L1, the other end of the first inductor L1 is configured to receive the first channel of signal of the digital signal, the second signal input of the first switch 302 is connected to one end of the second inductor L2, and the other end of the second inductor L2 is configured to receive the second channel of signal of the digital signal; herein, the first switch 302 may include: a switch S1 and a switch S2, the first signal input of the first switch is the signal input of switch S1, and the second signal input of the first switch is the signal input of switch S2. The second switch 303 may include: a switch S3 and a switch S4, the first signal input of the second switch is the signal input of switch S3, and the second signal input of the second switch is the signal input of switch S4. The first signal output of the second switch is the signal output of switch S3, and the second signal output of the second switch is the signal output of switch S4.

Optionally, the first matching branch 304a may further include a first resistor R1 connected in series with the first inductor L1 and a second resistor R2 connected in series with the second inductor L2.

As an example, the first signal input of the first switch is connected to one end of the first inductor L1, the other end of the first inductor L1 is connected to one end of the first resistor R1, and the other end of the first resistor R1 is configured to receive the first channel of signal of the digital signal; the second signal input of the first switch is connected to one end of the second inductor L2, the other end of the second inductor L2 is connected to one end of the second resistor R2, and the other end of the second resistor R2 is configured to receive the second channel of signal of the digital signal.

Optionally, the inductance values of the first inductor L1 and the second inductor L2 are equal.

At least one inductor in the second matching branch 304b may include: a third inductor L3 and a fourth inductor L4; the common interface 301 includes: a first signal input and a second signal input, the first switch 302 may further include: a first signal input and a second signal input, and the second switch 303 may further include: a first signal output and a second signal output.

The first signal input of the second switch 303 is configured to receive the first channel of signal of the analog signal, the second signal input of the second switch 303 is configured to receive the second channel of signal of the analog signal; the third inductor L3 is connected in series between the first signal output of the second switch 303 and the first signal input of the common interface 301, and the fourth inductor L4 is connected in series between the second signal output of the second switch 303 and the second signal input of the common interface 301. Optionally, the inductance values of the third inductor L3 and the fourth inductor L4 are equal.

In the above-mentioned circuit, when the interference-resistant branch includes only the first matching branch 304a, the first signal output of the second switch 303 is connected to the first signal input of the common interface 301, and the second signal output of the second switch 303 is connected to the second signal input of the common interface.

In the above-mentioned circuit, when the interference-resistant branch includes only the second matching branch 304b, the first signal input of the first switch 302 is configured to receive the first channel of signal of the digital signal, and the second signal input of the first switch 302 is configured to receive the second channel of signal of the digital signal.

As an example, the common interface may be a USB Type-C connector.

In actual implementation, the digital signal can be a high-speed digital signal, the analog signal can be an audio analog signal, and the high-speed digital signal or audio analog signal may be output through USB Type-C connector.

A signal transmission circuit provided by the embodiments of the present application includes: a common interface, a first switch, a second switch and an interference-resistant branch; herein, the common interface is configured, to receive a digital signal through the first switch when the first switch is closed; or to receive an analog signal through the second switch when the second switch is closed; the interference-resistant branch is configured to eliminate the interference of the second switch on the digital signal; a signal input of the interference-resistant branch is configured to receive the digital signal, and a signal output of the interference-resistant branch is connected to a signal input of the first switch; and/or the signal input of the interference-resistant branch is connected to a signal output of the second switch, and the signal output of the interference-resistant branch is connected to a signal input of the common interface. In this way, by means of adding an interference-resistant branch in the signal transmission circuit, the interference of the analog switch on the digital signal transmission is reduced, and the communication quality of the digital signal is guaranteed.

The signal transmission circuit according to the embodiments of the present application is further exemplified. In the embodiments of the present application, the common interface is a USB Type-C connector. The USB digital signal transceiver outputs high-speed digital signal, the audio amplifier outputs audio analog signal, and the high-speed digital signal and audio analog signal are output by means of multiplexing the USB Type-C connector.

Figure 6:
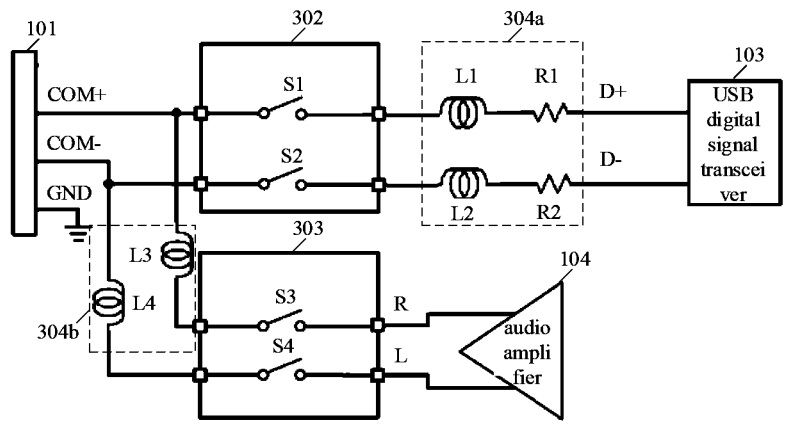
FIG. 6 is a fourth structure diagram of a signal transmission circuit according to an embodiment of the present application.

FIG. 6 is a fourth structure diagram of a signal transmission circuit according to an embodiment of the present application. As shown in FIG. 6, the circuit includes: a USB Type-C connector 101, a first switch 302, a second switch 303, and a USB digital signal transceiver 103, an audio amplifier 104, a first matching branch 304a, and a second matching branch 304b. In actual implementation, the circuit may further include only the first matching branch 304a or the second matching branch 304b.

It can be understood that, since the high-speed digital signal output by the USB digital signal transceiver is a differential signal which includes two channels of signals, and the audio analog signal output by the audio amplifier includes left channel signal and right channel signal, the digital channel and analog channel are required to use two channels of signal lines for signal transmission. Therefore, the first switch and the second switch need to have two independent switches to control the on-off of the two channels of signal lines.

Here, the first switch may include: a switch S1 and a switch S2, and the second switch may include: a switch S3 and a switch S4.

The first switch and the second switch each has a first pin, a second pin, a third pin, and a fourth pin. When the switch S1 is closed, the first pin and the third pin of the first switch are connected; when the switch S2 is closed, the second pin and the fourth pin of the first switch are connected; when the switch S3 is closed, the first pin and the third pin of the second switch are connected; when the switch S4 is closed, the second pin and the fourth pin of the second switch are connected.

The first pin of the first switch is connected to the pin COM+ of the USB Type-C connector, the second pin of the first switch is connected to the pin COM− of the USB Type-C connector; the third pin of the second switch is connected to the right channel signal R of the audio signal, and the fourth pin of the second switch is connected to the left channel signal L of the audio signal.

In the embodiments of the present application, when the circuit described above includes the first matching branch, the switch S1 of the first switch is connected in series to the first inductor L1 and the first resistor R1, and the first resistor R1 is connected to the pin D+ of the USB digital signal transceiver; the switch S2 is connected in series to the second inductor L2 and the second resistor R2, and the second resistor R2 is connected to the pin D− of the USB digital signal transceiver. The output of the switch S3 of the second switch is connected to the pin COM+ of the USB Type-C connector, and the output of the switch S4 of the second switch is connected to the pin COM− of the USB Type-C connector. The USB digital signal transceiver outputs high-speed digital signal through the pins D+ and D−, the high-speed digital signal is transmitted to the USB Type-C connector through the first matching branch and the first switch, and then output by the USB Type-C connector. The audio analog signal output by the audio amplifier is transmitted to the USB Type-C connector through the second switch, and then output by the USB Type-C connector.

In the embodiments of the present application, when the circuit described above includes the second matching branch, the switch S1 of the first switch is connected to the pin D+ of the USB digital signal transceiver, and the switch S2 is connected to the pin D− of the USB digital signal transceiver. The third inductor L3 is connected in series between the switch S3 of the second switch and the pin COM+ of the common interface, and the fourth inductor L4 is connected in series between the switch S4 of the second switch and the pin COM− of the common interface. The USB digital signal transceiver outputs high-speed digital signal through the pins D+ and D−, the high-speed digital signal is transmitted to the USB Type-C connector through the first switch, and then output by the USB Type-C connector. The audio analog signal output by the audio amplifier is transmitted to the USB Type-C connector through the second switch and the second matching branch, and then output by the USB Type-C connector.

In the embodiment of the present application, when the circuit described above includes a combination of the first matching branch and the second matching branch, the USB digital signal transceiver outputs high-speed digital signal through the pins D+ and D−, the high-speed digital signal is transmitted to the USB Type-C connector through the first matching branch and the first switch, and then output by the USB Type-C connector. The audio analog signal output by the audio amplifier is transmitted to the USB Type-C connector through the second switch and the second matching branch, and then output by the USB Type-C connector.

Here, as indicated in the USB Type-C specification, the pin COM+ of the USB Type-C connector is A6/B6, which is configured to connect to the pin D+ of the USB digital signal transceiver and connect to the right channel output pin of the audio amplifier; the pin COM− of the USB Type-C connector is A7/B7, which is configured to connect to the pin D− of the USB digital signal transceiver and connect to the left channel output pin of the audio amplifier.

In actual implementation, the first switch controls the on-off of the digital channel, and the digital channel is configured to transmit the high-speed digital signal output by the USB digital signal transceiver; the second switch controls the on-off of the analog channel, and the analog channel is configured to transmit the audio signal output by the audio amplifier. The high-speed digital signal may be a digital signal with a transmission rate higher than a preset value, for example, a digital signal with a baud rate higher than a preset baud rate.

In some embodiments, the second switch is open when the first switch is closed, or the second switch is closed when the first switch is open, or the second switch is also open when the first switch is open. It can be understood that the high-speed digital signal and audio signal (a type of analog signals) cannot be output at the same time, and can only be output separately, so the first switch and the second switch will not be closed at the same time. In addition, the pins COM+/− of the USB Type-C connector are multiplexed by the high-speed digital signal and audio signal, that is, the USB port in the terminal is multiplexed with the headphone port, so that the high-speed digital signal and audio signal are output with the same port, so as to reduce the output ports in the terminal.

In actual implementation, in order to ensure that the audio channel has a better THD+N index, the second switch can be a high-fidelity (HiFi) analog switch, and the THD+N index of the HiFi analog switch may reach more than −100 dB, which can guarantee an audio output of HiFi level.

Figure 7:
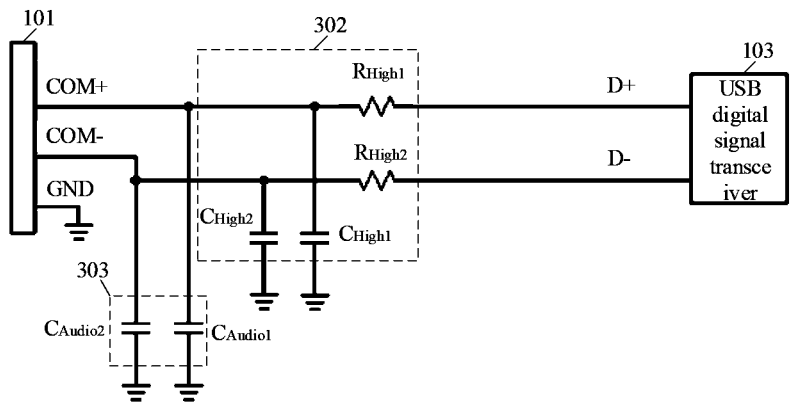
FIG. 7 is a schematic diagram of an equivalent circuit for the switching circuit in FIG. 2 according to an embodiment of the present application.

FIG. 7 is a schematic diagram of an equivalent circuit for the switching circuit in FIG. 2 according to an embodiment of the present application. As shown in FIG. 7, the first pin of the first switch 302 has a parasitic capacitance $C_{High1}$, and the second pin has a parasitic capacitance $C_{High2}$; the first pin of the second switch 303 has a parasitic capacitance $C_{Audio1}$, and the second pin has a parasitic capacitance $C_{Audio2}$. There is also an equivalent resistor $R_{High1}$ between the pin COM+ of the USB Type-C connector 101 and the pin D+ of the USB digital signal transceiver 103, and there is an equivalent resistor $R_{High2}$ between the pin COM− and the pin D− of the USB digital signal transceiver 103. When digital communication is performed, that is, when the first switch is closed and the second switch is open, the second switch port is in a high-impedance state. As the pins of the second switch are connected to the pins of the first switch, the parasitic capacitances $C_{Audio1}$ and $C_{Audio2}$ are added to the pins of the first switch. The combination of the parasitic capacitances of the two switches has a great interference on the communication of the digital channel, which compresses the bandwidth of the channel and leads to communication failure.

Figure 8:
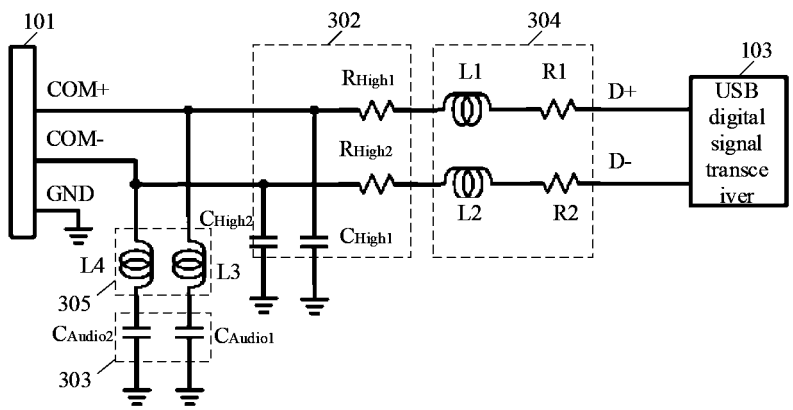
FIG. 8 is a schematic diagram of an equivalent circuit for the signal transmission circuit in FIG. 6 according to an embodiment of the present application.

In the embodiments of the present application, an interference-resistant branch is added to the signal transmission circuit to eliminate the interference of the second switch on the digital signal. FIG. 8 is a schematic diagram of an equivalent circuit for the signal transmission circuit in FIG. 6 according to an embodiment of the present application. As shown in FIG. 8, resistors R1 and R2 with the same resistance value and inductors L1 and L2 with the same inductance value are connected in series to two channels between the first switch 302 and the USB digital signal transceiver 103, to form a R-L series circuit; inductors L3 and L4 with the same inductance value are connected in series to two channels between the USB Type-C connector 101 and the second switch 303, the inductor L3 is connected in series with the parasitic capacitance $C_{Audio1}$, and the inductor L4 is connected in series with the parasitic capacitance $C_{Audio2}$, to form an L-C circuit. The L-C circuit becomes an L-C parallel circuit of the parasitic capacitance of the first switch 302.

It can be understood that in the L-C parallel circuit formed by the third inductor L3 and the parasitic capacitor $C_{Audio1}$, the fourth inductor L4 and the parasitic capacitor $C_{Audio2}$ relative to the parasitic capacitance of the first switch, the lower the resonant frequency f on the L-C parallel circuit (due to f=½π√LC that is the larger L3 and L4), the better the effect of improving the quality of the digital signal. In the embodiment of the present application, when the resonance frequency value f of the L-C parallel circuit is less than one tenth of the high-speed data rate value (the high-speed data rate may be 480 Mb/s), the influence of the parasitic capacitance of the pin of the second switch 303 on the digital channel communication can be reduced, and digital signal quality can be guaranteed.

In actual implementation, when the inductance value and the resistance value are configured through simulation, an eye diagram test can be used to observe whether the digital signal output by the digital channel meets the signal quality requirements.

Figure 9:
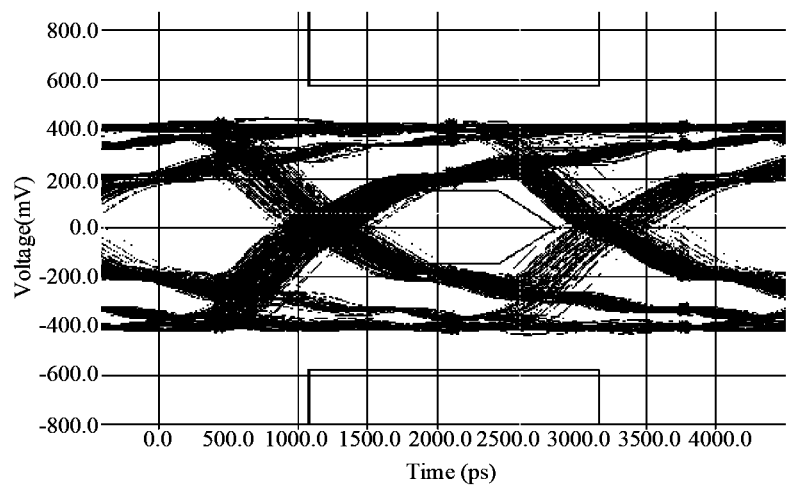
FIG. 9 is a schematic diagram of a digital signal output waveform of the switching circuit of a dual analog switch according to an embodiment of the present application.

FIG. 9 is a schematic diagram of a digital signal output waveform of the switching circuit of a dual analog switch according to an embodiment of the present application. As shown in FIG. 9, at present, eye diagram test is widely used for digital signal test. The digital signal outputs by the USB digital signal transceiver in FIG. 9 is a differential signal, and the waveform shown in the figure is a differential signal waveform without interference-resistant branch. In the template currently used for eye diagram test, the vertical coordinate represents the voltage amplitude whose unit is millivolt (Voltage/mV), the horizontal coordinate represents the time whose unit is picosecond (Time/ps). The middle hexagon area is used to determine the quality of the signal. When the waveform of the digital signal moves further away from the hexagonal area, and the change range of the voltage amplitude of the digital signal does not exceed an upper limit of the voltage amplitude indicated by a lower edge of the upper rectangular box in the figure and a lower limit of the voltage amplitude indicated by an upper edge of the lower rectangular box in the figure, the digital signal meets the signal quality requirements. Once the hexagonal area is covered by the waveform of the digital signal, it means that the test has failed and the current digital signal does not meet the signal quality requirements. The height of the Eye Mask in the diagram is limited to: −150 mV to +150 mV, the upper limit of the digital signal voltage amplitude is −575 mV, and the lower limit is +575 mV. It can be seen that in the circuit without interference-resistant branch, the digital signal waveform output by the USB Type-C interface is very close to the hexagonal area of the eye diagram, and some waveforms have covered this area, and the output digital signal waveform does not meet the signal quality requirements.

Figure 10:
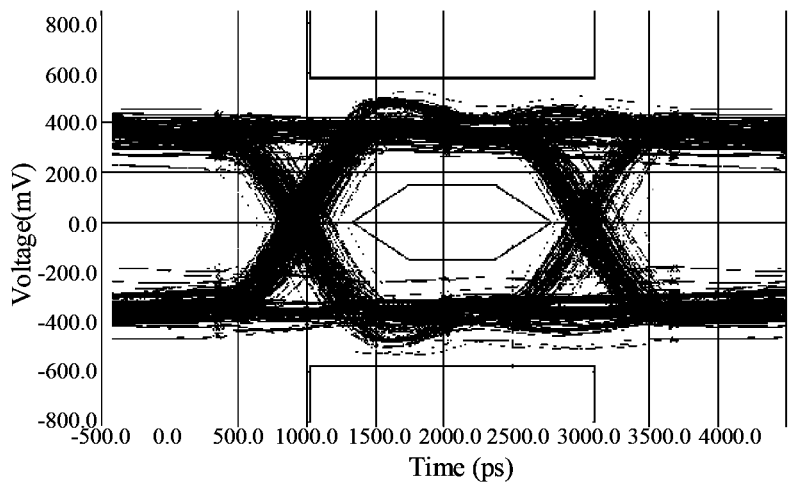
FIG. 10 is a schematic diagram of a digital signal output waveform of a signal transmission circuit according to an embodiment of the present application.

FIG. 10 is a schematic diagram of a digital signal output waveform of a signal transmission circuit according to an embodiment of the present application. As shown in FIG. 10, after an interference-resistant branch is added to the signal transmission circuit, the output digital signals are all located outside the hexagonal area, far away from the hexagonal area, and a voltage variation amplitude for the digital signal meets the requirements, therefore, the digital signal meets the signal quality requirements.

In actual implementation, the configuration method for the inductor and resistor of the interference-resistant branch in the signal transmission circuit may be determined through simulation; the digital channel between the first switch and the USB digital signal transceiver and the audio channel between the second switch and the audio amplifier can be selected in an alternative manner to configure inductor for one channel, or both of the two channels may be configured with inductor.

Figure 11:
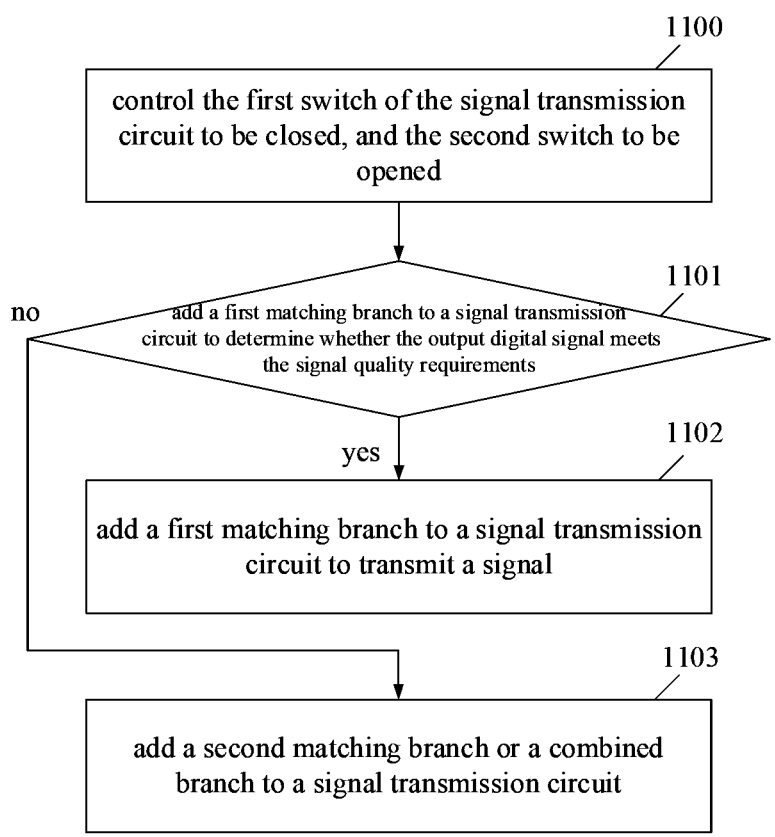
FIG. 11 is a schematic flowchart of an embodiment of a method for configuring a signal transmission circuit according to an embodiment of the present application.

FIG. 11 is a schematic flowchart of an embodiment of a method for configuring a signal transmission circuit according to an embodiment of the present application. As shown in FIG. 11, the method includes:

Step 1100: controlling the first switch of the signal transmission circuit to be closed, and the second switch to be opened.

In actual implementation, the switch control signal can be transmitted through the control bus ($V_{BUS\_CTRL}$) of the USB Type-C connector, to control the on-off of the first switch and the second switch.

Step 1101: adding a first matching branch to a signal transmission circuit to determine whether the output digital signal meets the signal quality requirements; if yes, executing step 1102; if no, executing step 1103.

It should be noted that when the analog signal is an audio signal, in order to reduce the noise of the audio signal, a higher-cost winding inductor should be used in the second matching branch. As a lower-cost stacked inductor can be used in the first matching branch, the first choice is to add the first matching branch in the signal transmission circuit to determine whether the output digital signal meets the signal quality requirements. If not, it is considered to add a second matching branch.

In some embodiments, when the first matching branch is added to the signal transmission circuit, the inductance value of the first inductor may be configured within a preset value range for the inductance value of the first inductor L1, and the inductance value of the second inductor L2 may be configured within a preset value range for the inductance value of the second inductor L2.

As an example, when the output digital signal is a differential signal, the signal quality requirements include: the limit of the Eye Mask height in the eye diagram test is: −150 mV to +150 mV, the upper limit of the digital signal voltage amplitude is −575 mV, and the lower limit is +575 mV.

Step 1102: adding a first matching branch to a signal transmission circuit to transmit a signal.

Step 1103: adding a second matching branch or a combined branch to a signal transmission circuit.

In some embodiments, when only adding the first matching branch in the signal transmission circuit fails to make the output digital signal meet the signal quality requirements, the first matching branch can be removed and the second matching branch can be added, or the first matching branch and the second matching branch may be added at the same time, and the parameters for the inductor and resistor are configured again through the simulation and the like.

The above are only specific embodiments of the present application, but the scope of protection of the present application is not limited to this. Any changes or replacements that can be easily thought of by person skilled in the art within the technical scope disclosed by the present application should be covered within the scope of protection of the present application. Therefore, the protection scope of the present application should be subject to the protection scope of the claims.

INDUSTRIAL APPLICABILITY

In the embodiments of the present application, an interference-resistant branch is configured at the input end of the common interface of the signal transmission circuit; when the first switch on the digital channel where the digital signal is transmitted is closed, the introduced interference-resistant branch is used to eliminate the interference of the second switch for the analog channel where the analog signal is located on digital signal. In this way, on one hand, through different channels where different switches are located, the analog signal and digital signal can share the interfaces and transmitted in different channels. Meanwhile, through interference-resistant branch, the interference of analog channel on digital signal is eliminated, the communication quality of digital signal is ensured, which has positive industrial effect; moreover, the implementation is simple and can be widely implemented in industry.

What is claimed is:

1. A signal transmission circuit, comprising: a common interface, a first switch, a second switch, and an interference-resistant branch; wherein
the common interface is configured to, receive a digital signal through the first switch when the first switch is closed, or to receive an analog signal through the second switch when the second switch is closed;
the interference-resistant branch is configured to eliminate an interference of the second switch on the digital signal;
a signal input of the interference-resistant branch is configured to receive the digital signal, and a signal output of the interference-resistant branch is connected to a signal input of the first switch; and/or, the signal input of the interference-resistant branch is connected to a signal output of the second switch, and the signal output of the interference-resistant branch is connected to a signal input of the common interface.

2. The circuit according to claim 1, wherein the interference-resistant branch comprises: a first matching branch, a second matching branch, or a combination branch of the first matching branch and the second matching branch.

3. The circuit according to claim 2, wherein a signal input of the first matching branch is configured to receive the digital signal, and a signal output of the first matching branch is connected to the signal input of the first switch; a signal input of the second matching branch is connected to the signal output of the second switch, and a signal output of the second matching branch is connected to the signal input of the common interface.

4. The circuit of claim 2, wherein the first matching branch comprises at least one inductor connected in series with the signal input of the first switch.

5. The circuit according to claim 4, wherein the inductor in the first matching branch is further connected in series with a resistor.

6. The circuit according to claim 4, wherein,
the at least one inductor in the first matching branch comprises: a first inductor and a second inductor;
the common interface comprises: a first signal input and a second signal input;
the first switch comprises: a first signal input, a second signal input, a first signal output, and a second signal output;
the second switch comprises: a first signal input, a second signal input, a first signal output and a second signal output;
the digital signal comprises: a first channel of signal and a second channel of signal;
the analog signal comprises: a first channel of signal and a second channel of signal;
the first signal input of the first switch is connected to one end of the first inductor, the other end of the first inductor is configured to receive the first channel of signal of the digital signal; the second signal input of the first switch is connected to one end of the second inductor, the other end of the second inductor is configured to receive the second channel of signal of the digital signal; the first signal output of the first switch is connected to the first signal input of the common interface, the second signal output of the first switch is connected to the second signal input of the common interface; the first signal input of the second switch is configured to receive the first channel of signal of the analog signal, and the second signal input of the second switch is configured to receive the second channel of signal of the analog signal; the first signal output of the second switch is connected to the first signal input of the common interface, and the second signal output is connected to the second signal input of the common interface.

7. The circuit according to claim 6, wherein an inductance value of the first inductor is equal to an inductance value of the second inductor.

8. The circuit according to claim 6, wherein the inductor in the first matching branch is a stacked inductor.

9. The circuit according to claim 6, wherein the first matching branch further comprises a first resistor connected in series with the first inductor and a second resistor connected in series with the second inductor.

10. The circuit according to claim 2, wherein the second matching branch comprises at least one inductor connected in series between the common interface and the second switch.

11. The circuit according to claim 10, wherein the at least one inductor in the second matching branch comprises: a third inductor and a fourth inductor;
the common interface comprises: a first signal input and a second signal input;
the first switch comprises: a first signal input, a second signal input, a first signal output, and a second signal output;
the second switch comprises: a first signal input and a second signal input, a first signal output and a second signal output;
the digital signal comprises: a first channel of signal and a second channel of signal;
the analog signal comprises: a first channel of signal and a second channel of signal;
the first signal input of the second switch is configured to receive the first channel of signal of the analog signal, and the second signal input of the second switch is configured to receive the second channel of signal of the analog signal; the third inductor is connected in series between the first signal output of the second switch and the first signal input of the common interface, and the fourth inductor is connected in series between the second signal output of the second switch and the second signal input of the common interface; the first signal input of the first switch is configured to receive the first channel of signal of the digital signal, the second signal input of the first switch is configured to receive the second channel of signal of the digital signal; the first signal output of the first switch is connected to the first signal input of the common interface, and the second signal output of the first switch is connected to the second signal input of the common interface.

12. The circuit according to claim 11, wherein an inductance value of the third inductor is equal to an inductance value of the fourth inductor.

13. The circuit according to claim 10, wherein the inductor in the second matching branch is a winding inductor.

14. The circuit according to claim 1, wherein the common interface is a universal serial bus type C connector.

* * * * *